(12) United States Patent
Chen et al.

(10) Patent No.: US 12,400,834 B2
(45) Date of Patent: Aug. 26, 2025

(54) CANTILEVER WITH ETCH CHAMBER FLOW DESIGN

(71) Applicant: Taiwan Semiconductor Manufacturing Company, Ltd., Hsinchu (TW)

(72) Inventors: Chien-Liang Chen, New Taipei (TW); Chien-Yu Wang, Hsinchu (TW); Wei-Da Chen, Hsinchu County (TW); Yu-Ning Cheng, Hsinchu (TW); Shih-tsung Chen, New Taipei (TW); Yung-Yao Lee, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 643 days.

(21) Appl. No.: 17/405,066

(22) Filed: Aug. 18, 2021

(65) Prior Publication Data

US 2022/0359164 A1    Nov. 10, 2022

Related U.S. Application Data

(60) Provisional application No. 63/185,572, filed on May 7, 2021.

(51) Int. Cl.
*H01L 21/00* (2006.01)
*H01J 37/32* (2006.01)
*H01L 21/687* (2006.01)

(52) U.S. Cl.
CPC .. *H01J 37/32449* (2013.01); *H01J 37/32568* (2013.01); *H01J 37/32834* (2013.01); *H01L 21/68792* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 4,504,349 A | * | 3/1985 | Ueno | B29C 59/14 216/58 |
| 4,553,069 A | * | 11/1985 | Purser | H01L 21/67751 250/442.11 |
| 5,767,628 A | * | 6/1998 | Keller | H01J 37/3211 343/788 |
| 6,132,517 A | * | 10/2000 | Sivaramakrishnan | C23C 16/4586 156/345.31 |
| 8,815,047 B2 | * | 8/2014 | Chae | H01J 37/32009 118/728 |
| 10,814,430 B2 | * | 10/2020 | Wakelam | B22F 10/322 |
| 11,387,082 B2 | * | 7/2022 | Azumano | H01J 37/32174 |
| 11,387,083 B2 | * | 7/2022 | Azumano | H01L 21/67069 |

(Continued)

FOREIGN PATENT DOCUMENTS

JP    2006114933 A  *  4/2006  ........ H01J 37/32091

*Primary Examiner* — Parviz Hassanzadeh
*Assistant Examiner* — Michelle Crowell
(74) *Attorney, Agent, or Firm* — Lippes Mathias LLP

(57) ABSTRACT

A cantilever for gas flow direction control configured to support an electrode housing bowl in an associated etch process chamber. The cantilever may have a cross-section that is circular, elliptical, or airfoil shaped. The shape of the cantilever induces the flow of gas and etch products within the chamber around the cantilever, reducing turbulence around the edge of a wafer.

16 Claims, 8 Drawing Sheets

(56) References Cited

U.S. PATENT DOCUMENTS

| | | | | |
|---|---|---|---|---|
| 2008/0171444 A1* | 7/2008 | Dhindsa | ............ | H01J 37/32091 |
| | | | | 156/345.48 |
| 2009/0199766 A1* | 8/2009 | Tappan | ............. | H01J 37/32091 |
| | | | | 118/723 I |
| 2011/0147618 A1* | 6/2011 | Zhang | .................... | B82Y 40/00 |
| | | | | 250/492.2 |
| 2011/0162801 A1* | 7/2011 | Zhang | ............... | H01J 37/32715 |
| | | | | 156/345.43 |

\* cited by examiner

CANTILEVER WITH ETCH CHAMBER FLOW DESIGN

PRIORITY CLAIM AND CROSS-REFERENCE

This application claims the benefit of U.S. Provisional Application Ser. No. 63/185,572 filed May 7, 2021, and titled NEW CANTILEVER DESIGN WITH ETCH CHAMBER FLOW MECHANICS. U.S. Provisional U.S. Provisional Application Ser. No. 63/185,572 filed May 7, 2021, and titled NEW CANTILEVER DESIGN WITH ETCH CHAMBER FLOW MECHANICS is incorporated herein by reference in its entirety.

BACKGROUND

The following relates to systems and components for control of gas flow within an etching chamber. Integrated circuits are formed on a semiconductor substrate, which is typically comprised of silicon. Such formation involves sequential deposition of various materials in layers or films, e.g., conductive and nonconductive layers. Etching processes may be used to form geometric patterns in the layers or vias for electrical contact between the layers. Etching processes may include "wet" etching, wherein a solvent or chemical reagent is used, or "dry" etching, wherein plasma is used. Such processes utilize a gas or fluid for etching, and flow of the gas or fluid impacts wafer quality and uniformity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
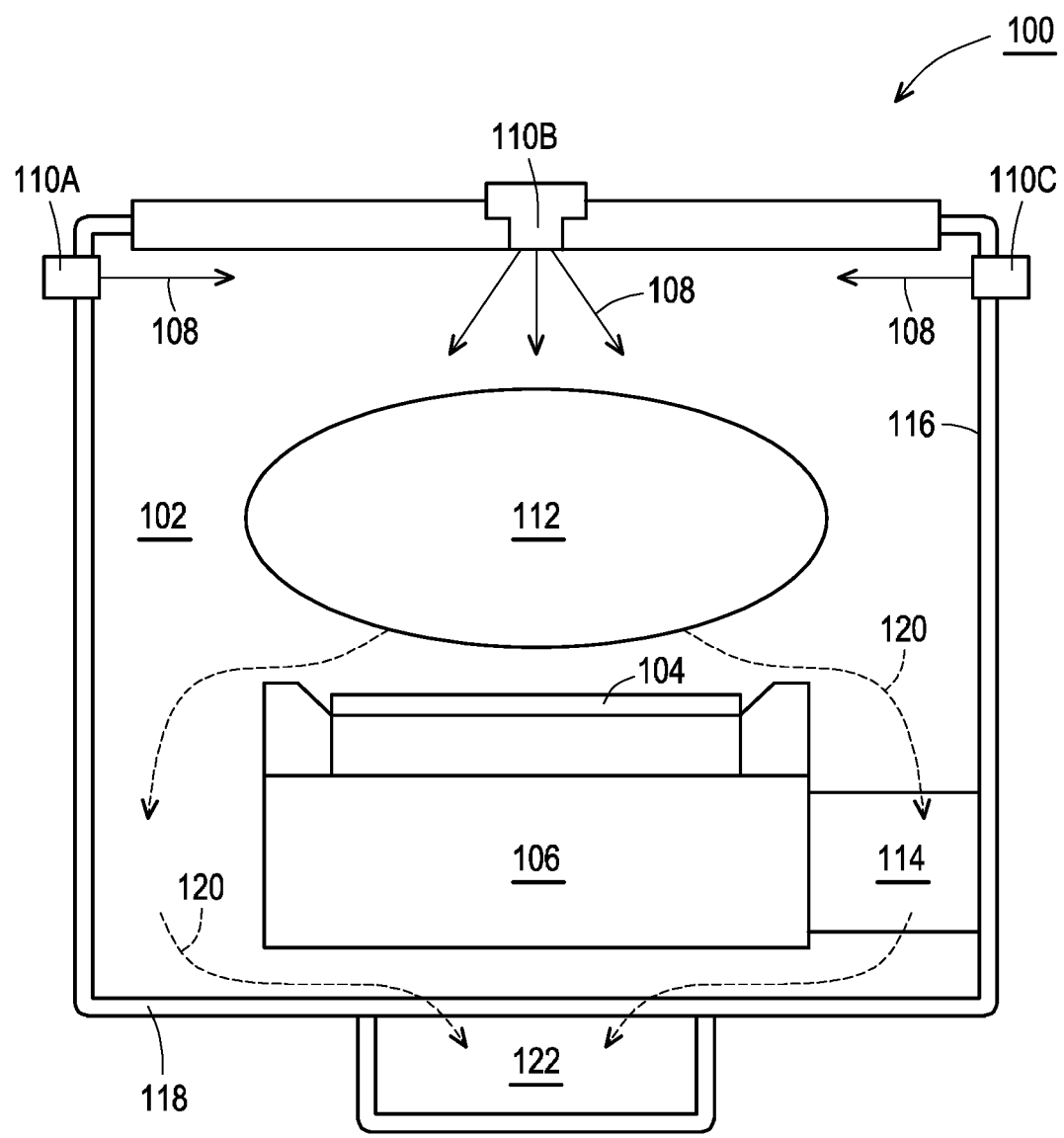
FIG. 1 illustrates an exemplary semiconductor manufacturing apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g., "about 2 to about 4" also discloses the range "from 2 to 4." The term "about" may refer to plus or minus 10% of the indicated number.

Dry etching processes, also referred to as plasma etching processes, are carried out to etch various films at various stages of the semiconductor manufacturing operation and produce various device features. Multiple plasma etching operations are sometimes used during fabrication of a semiconductor device. Various types of plasma etching processes are known in the art, including plasma etching, reactive ion (RI) etching and reactive ion beam etching. In each of these plasma processes, a gas is first introduced into a reaction chamber and then plasma is generated from the gas. This is accomplished by dissociation of the gas into ions, free radicals, and electrons by using an RF (radio frequency) generator, which includes one or more electrodes. The electrodes are accelerated in an electric field generated by the electrodes, and the energized electrons strike gas molecules to form additional ions, free radicals, and electrons, which strike additional gas molecules, and the plasma eventually becomes self-sustaining. The ions, free radicals and electrons in the plasma react chemically with the layer material on the semiconductor wafer to form residual products which leave the wafer surface and thus, etch the material from the wafer.

In the fabrication of semiconductor devices, particularly sub-micron scale semiconductor devices, profiles obtained in the etching process are very important. Careful control of a surface etch process is therefore necessary to ensure directional etching. In conducting an etching process, when an etch rate is considerably higher in one direction than in the other directions, the process is called anisotropic. A reactive ion etching (RIE) process assisted by plasma is frequently used in an anisotropic etching of various material layers on top of S semiconductor substrate. In plasma enhanced etching processes, the etch rate of a semiconductor material is frequently larger than the sum of the individual etch rates for ion sputtering and individual etching due to a synergy in which chemical etching is enhanced by ion bombardment.

To avoid subjecting a semiconductor wafer to high-energy ion bombardment, the wafer may also be placed downstream from the plasma and outside the discharge area. Downstream plasma etches more in an isotropic manner since there are no ions to induce directional etching. The downstream reactors are frequently used for removing resist or other layers of material where patterning is not critical. In a downstream reactor, radio frequency may be used to generate long-lived radioactive species for transporting to a wafer surface located remote from the plasma. During these etching processes, gas and etch products are introduced and produced, with the flow of such gas and etch products being impacted by the location of the wafer within the chamber, the components, such as a cantilever, supporting the wafer. Such impacted flow can deleteriously affect wafer quality, uniformity, critical depth, and the like.

Turning now to FIG. 1, there is shown a semiconductor manufacturing apparatus 100 in accordance with one embodiment of the subject application. As illustrated in FIG. 1, the semiconductor manufacturing apparatus 100 includes a chamber 102 for accommodating a wafer 104 during operation of the apparatus 100. An electrode housing bowl 106 is positioned within the chamber 102 and configured to hold the wafer 104 therein. In some embodiments, the electrode housing bowl 106 includes an electrostatic chuck (ESC), a vacuum component, a heater, and/or other mechanism, as well be appreciated by those skilled in the art. In such embodiments, the electrode housing bowl 106 is configured to secure the wafer 104 in a position for processing during operations of the semiconductor manufacturing apparatus 100.

The electrode housing bowl 106 is depicted in FIG. 1 as being supported within the chamber 102 by a cantilever 114, extending perpendicularly from an inner wall 116 of the chamber 102 to the center of the chamber. It will be appreciated by those skilled in the art the depiction of the cantilever 114 extending perpendicularly from one inner wall 116 of the chamber 102 is intended as an example only. The cantilever 114 may be attached to any portion of the inner wall 116 of the chamber 102 in accordance with the various embodiments disclosed herein. In some embodiments contemplated herein, in addition to support, power and controls for the electrode housing bowl 106 may be routed through the cantilever 114.

As shown in FIG. 1, the cantilever 114 supports the electrode housing bowl 106 above a bottom 118 of the chamber 102. Gas 108, supplied from an external source, flows into the interior of the chamber 102 via gas inlets 110A, 1108, and 110C. It will be understood that the depicting of three gas inlets 110A-C is intended as an example, and the semiconductor manufacturing apparatus 100 may include one, two, three, four, five or more inlets to enable gas 108 to enter the chamber 102. In some embodiments, the gas 108 introduced into the chamber 102 is ignited by a power source such as a radio frequency (RF) generator to generate the plasma 112. The electrode housing bowl 106 may include an electrode (not shown) configured to ignited and sustain a plasma 112 reaction within the chamber 102. The plasma 112 may interact with deposition film on the wafer during a dry etch process. The gas 108 may include, for example and without limitation, $C_xH_yF_z$ where x is 1 to 6, y is 0 to 6, and z is 1 to 6; He; Ar; $F_2$; $Cl_2$; $O_2$; $N_2$; $H_2$; HBr; HF; $NF_3$; or $SF_6$; or the like.

The gas 108, energized via a coil (not shown) is introduced above the wafer 104 to generate ionized particles. These particles are dropped on the top surface of the wafer 104 and react with the deposited film. Some inert gases, such as nitrogen, argon, or helium may be introduced into the chamber 102 via gas inlets 110A, 110B, or 110C as a carrier gas to distribute the ionized particles more evenly in the chamber 102. It will be appreciated that inert gas may be used in plasma etching as a diluent and a plasma stabilizer. Diluents may provide a process control variable. For example, an inert gas may be added to increase a total pressure while keeping partial pressures of other gases constant. It may further be appreciated that some gas species may improve the energy transfer from "hot" electrons to reactive gas molecules. Etch products 120, such as, for example and without limitation FCN; $CO_x$ where x is 1 or 2; $SiCl_x$ where x is 1 to 4; or $SiF_x$ where x is 1 to 4, may be removed from the chamber 102 via a gas removal mechanism, shown in FIG. 1 as the pump 122. It will be appreciated that the location of the pump 122 depicted in FIG. 1 is intended as a non-limiting example of the location of the pump 122 relative to the process chamber 102. The skilled artisan will appreciate that placement of the pump 122 with respect to the chamber 102 may depend upon the type of process chamber, the materials being pumped, the location of the electrode housing bowl 106, the location of the cantilever 114, the location of outlets in the chamber 102, any myriad other factors.

Figure 2A:
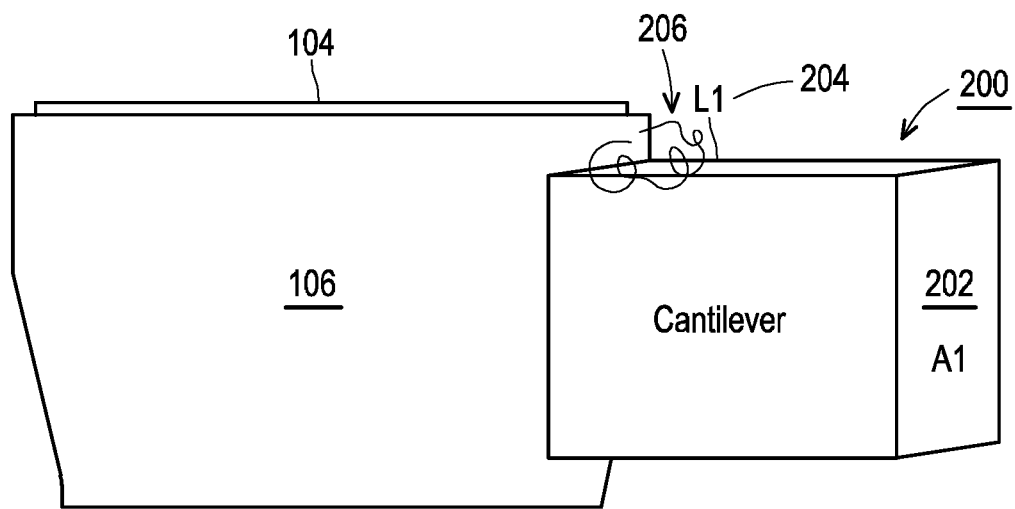
FIG. 2A illustrates a cantilever utilized by the exemplary manufacturing apparatus in accordance with one embodiment of the subject application.

Referring now to FIG. 2A, there is shown an illustration of a cantilever 202 utilized in the semiconductor manufacturing apparatus 100 in accordance with one embodiment of the subject application. As depicted in FIG. 2A, the cantilever 200 is illustrated as a uniform support pin, having a square or rectangular cross section A1 202 and a length L1 204. In this example, the square/rectangular cantilever 200 may be positioned such that the top portion/surface of the square/rectangular cantilever cross-section A1 202 is lower than or equal to the bottom of the wafer 104, and the bottom portion of the square/rectangular cantilever cross-section A1 202 is positioned higher than or equal to the top portion of the pump 122.

Figure 2B:
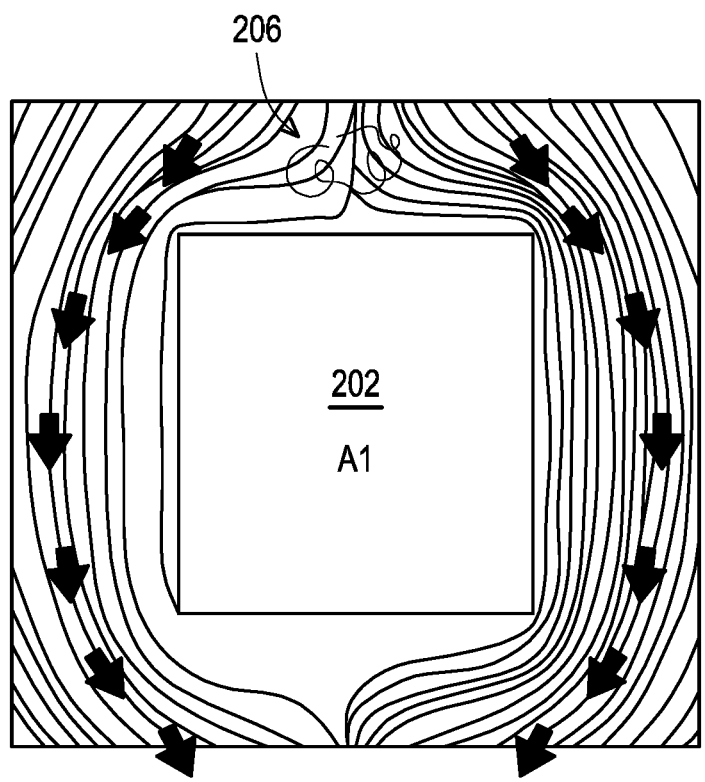
FIG. 2B illustrates a cross-sectional view of the cantilever of FIG. 2A in accordance with one embodiment of the subject application.

FIG. 2B provides a cross-sectional view of the cantilever 200 during operations of the semiconductor manufacturing apparatus 100, i.e., as the etch gas 108 is flowing into the chamber 102. As shown in FIG. 2B, the configuration of the cantilever 200 may result in turbulence 206 forming on the top side of the cantilever 200. This is due to the top surface of the cantilever being substantially parallel to the surface of the wafer. The skilled artisan will appreciate that the turbulence 206 may form in the flow of etch gas 108 and/or the flow of etch product 120 during operations of the semiconductor manufacturing apparatus 100. As will be appreciated by those skilled in the art, the turbulence 206 may impact wafer edge physical quality (e.g., profile, critical dimension, depth uniformity percentage, and the like), polymer defect removal, and the like. Furthermore, it will be appreciated that the foregoing may impact wafer acceptance testing, commercially pure yield enhancements, and the like. That is, high flow turbulence 206 induces problematic wafer-edge physical qualities.

Figure 3A:
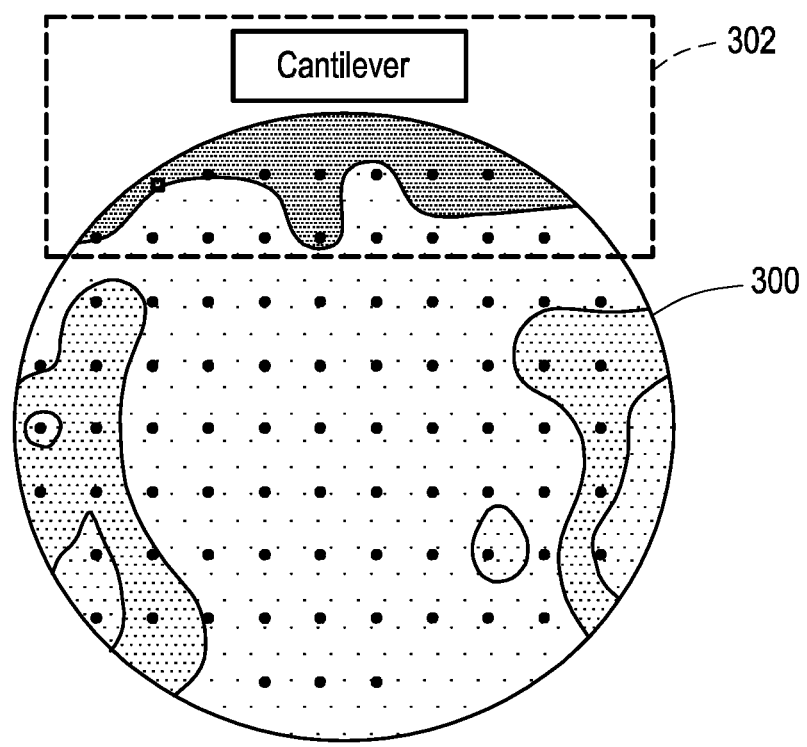
FIG. 3A provides an exemplary wafer produced by the semiconductor manufacturing apparatus and cantilever of FIGS. 2A-2B in accordance with one embodiment of the subject application.

FIG. 3A provides an illustrative wafer 300 after an etch process performed in the chamber 102 of the semiconductor manufacturing apparatus 100 utilizing the cantilever 200 of FIG. 2A. As shown in FIG. 3A, the turbulence 206 formed by the top of the cantilever 200 impacts the wafer edge physical quality, illustrated as the turbulence area 302 in FIG. 3A. Each diamond shown in FIG. 3A corresponds to a critical dimension (CD) of the etching pattern on the wafer 300. It will be appreciated that the diamonds within the turbulence area 302 caused by the cantilever 200 are outside the acceptable SVT CD, with the variance in CD more readily apparent the closer to the edge of the wafer 300, i.e., variance increases in proximity to the cantilever 200. The skilled artisan will appreciate that the illustrations presented in FIGS. 3A-3B are intended solely as non-limiting examples of a wafer 104 produced by the semiconductor manufacturing apparatus 100 of FIG. 1 utilizing the square/rectangular cantilever 200 of FIGS. 2A-2B.

Figure 3B:
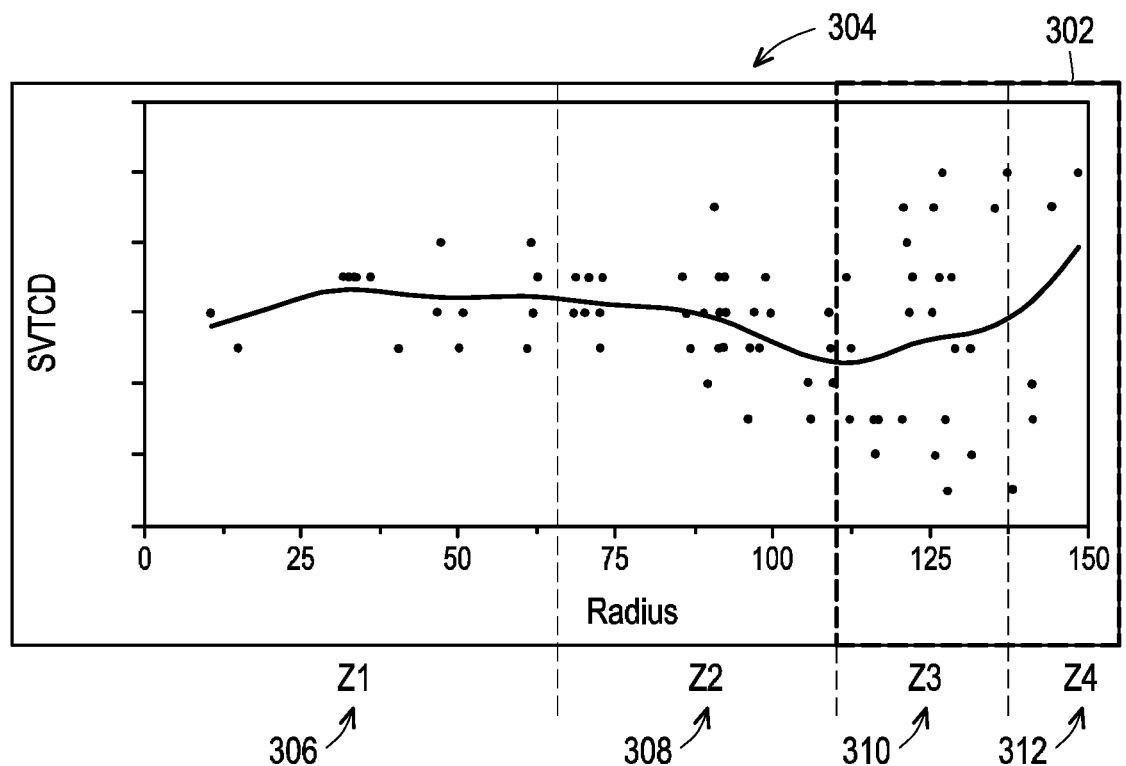
FIG. 3B provides an illustrative graph corresponding to the wafer of FIG. 3A.

FIG. 3B provides a graphical representation 304 of the diamonds on the wafer 300 produced by the semiconductor manufacturing apparatus 100 utilizing the cantilever 200. The left side of the graph 304 corresponds to the CD referenced above of the etch pattern. The bottom of the graph 304 is divided into four zones (Z1 306, Z2 308, Z3 310, and Z4 312), with each zone Z1-Z4 (306-312) representative of concentric circles by radius of the wafer 300. For illustrative purposes, the turbulence area 302, located in zones Z3 310 and Z4 312 more clearly depict the increase in variance of CD values associated with the square/rectangular cross-sectioned cantilever 200 of FIGS. 2A-2B.

Figure 4A:
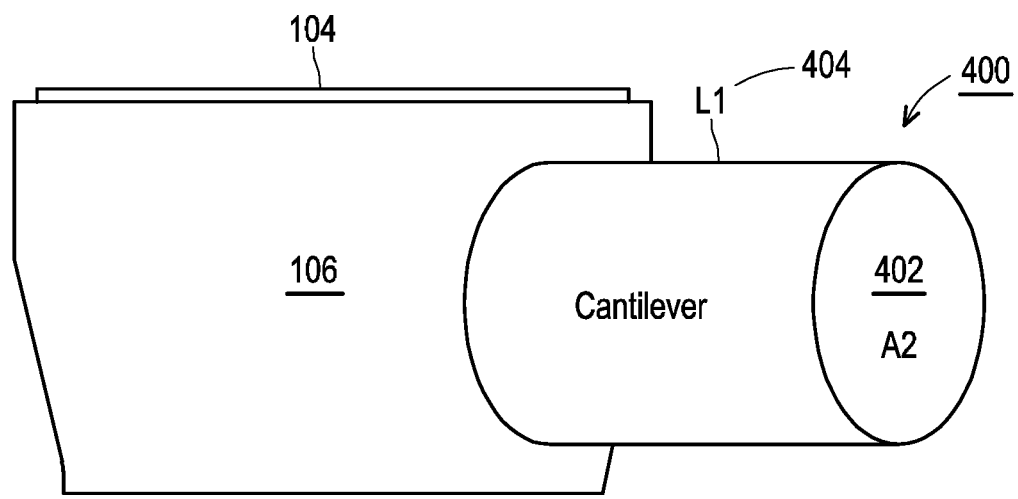
FIG. 4A provides an illustration of a cylindrical cantilever for use in a semiconductor manufacturing apparatus in accordance with one embodiment of the subject application.

Turning now to FIG. 4A, there is shown an alternate cantilever 400 for use in the semiconductor manufacturing apparatus 100 in accordance with one embodiment of the subject application. Generally, the cantilever has a curved profile, which reduces turbulence at the edges of the wafer. As depicted in FIG. 4A, the cantilever 400 is generally cylindrical in shape, having a cross-section A2 402 and a length L1 404. It will be appreciated that the lengths L1 204 and 404 have the same value in a direct exchange of the cylindrical cantilever 400 for the square/rectangular cantilever 200, as the length L1 204, 404 is determined in accordance with the position of the electrode housing bowl 106 within the chamber 102.

Figure 4B:
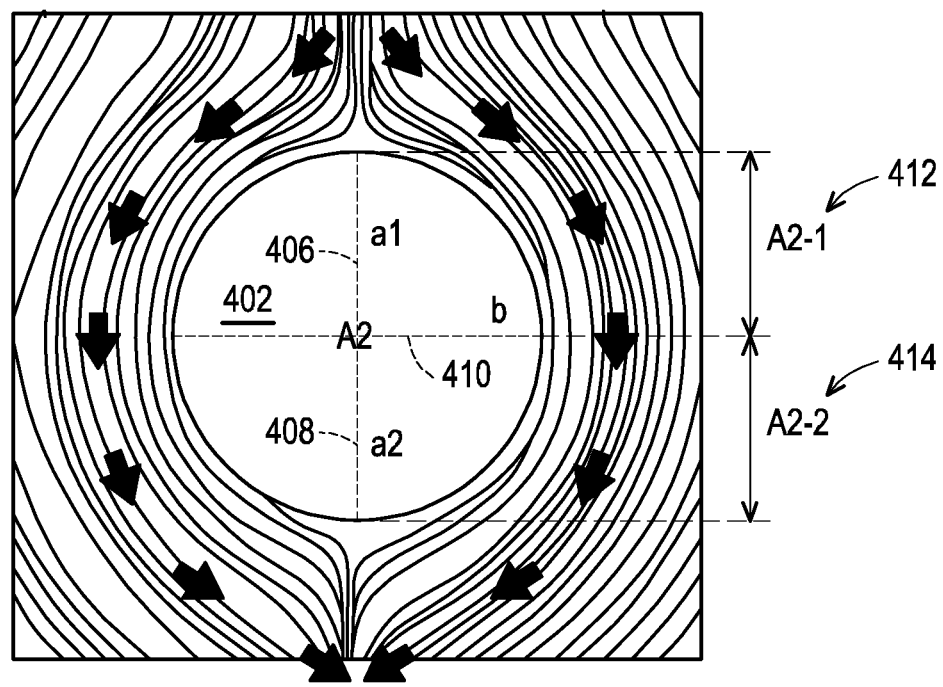
FIG. 4B provides an illustration of the cylindrical cantilever of FIG. 4A during operations of a semiconductor manufacturing apparatus in accordance with one embodiment of the subject application.

FIG. 4B provides a cross-sectional view of the cylindrical cantilever 400 during operations of the semiconductor manufacturing apparatus 100, i.e., as gas 108 and/or etch products 120 are flowing within the chamber 102. In accordance with one exemplary embodiment, the cantilever 400 comprises a cross-sectional area A2 402 that is defined by: 0.1 cm$^2 \leq$A2$\leq$70685 ($\pi$*a*b) cm$^2$. In such an example, the cantilever 400 utilizes a radius (e.g. a1 406, a2 408, b 410), with the length A2-1 412 (associated with radius a1 406) defined by: 0.1 cm$\leq$b$\leq$a1$\leq$150 cm and the length A2-2 414 (associated with radius a2 408) defined by: 0.1 cm$\leq$b$\leq$a2$\leq$150 cm. The cross-sectional area is considered along the axis joining the electrode housing bowl to the interior wall of the process chamber. In this example, the cylindrical cantilever 400 may be positioned such that the top portion of the cylindrical cantilever cross-section A2 402 is lower than or equal to the bottom of the wafer 104, and the bottom portion of the cylindrical cantilever cross-section A2 402 is positioned higher than or equal to the top portion of the pump 122.

As will be appreciated by those skilled in the art, the cylindrical cantilever 400 of FIGS. 4A-4B improve the flow mechanics within the chamber 102. That is, the flow of gas 108 and etch products 120 is improved as they flow around the curved outer surface of the cantilever 400 in contrast to the flat top portion of the cantilever 200 of FIGS. 2A-2B. In accordance with one exemplary embodiment, the flow mechanics provided by the cylindrical (i.e., curved) cantilever 400 prevent or reduce turbulence occurring along the top of the cantilever 400, in contrast to the cantilever 200 of FIGS. 2A-2B.

In accordance with one example embodiment, the semiconductor manufacturing apparatus 100 of FIG. 1 uses the cylindrical cantilever 400. In such an example embodiment, the cylindrical cantilever 400 is positioned within the chamber 102, and affixed at one end to the inner chamber wall 116. At the opposite end of the cylindrical cantilever 400, the electrode housing bowl 106 is attached to support a wafer 104 during an etch process.

As an etch gas 108 is introduced into the chamber 102 via the inlets 110A, 110B, and/or 110C, an electrode (not shown) within the housing bowl 106 is activated via a suitable source, e.g., an RF match source, high voltage source, or the like. A plasma sheath or cloud 112 is formed over the wafer 104 within the chamber 102 and etching of the wafer 104 occurs. During this etching, the gas 108 is induced to move without turbulence over the cylindrical cantilever 400, as shown in FIG. 4B. While this is occurring, it will be appreciated that etch products 120 are also induced to move without turbulence over the cylindrical cantilever 400 toward the pump 122 positioned at the bottom of the chamber 102 and configured to extract or remove the extraneous etch gas 108 and/or etch products 120 induced to flow by the cylindrical cantilever 400. In other embodiments contemplated herein, the pump 122 may be positioned in the center of the bottom 118 of the process chamber 102, or may be located below the cylindrical cantilever 400. The skilled artisan will appreciate that the location of the pump 122 may be dependent upon the type of process chamber 102, the type of etch product 120, the type of etch gas 108, and the like.

Figure 5A:
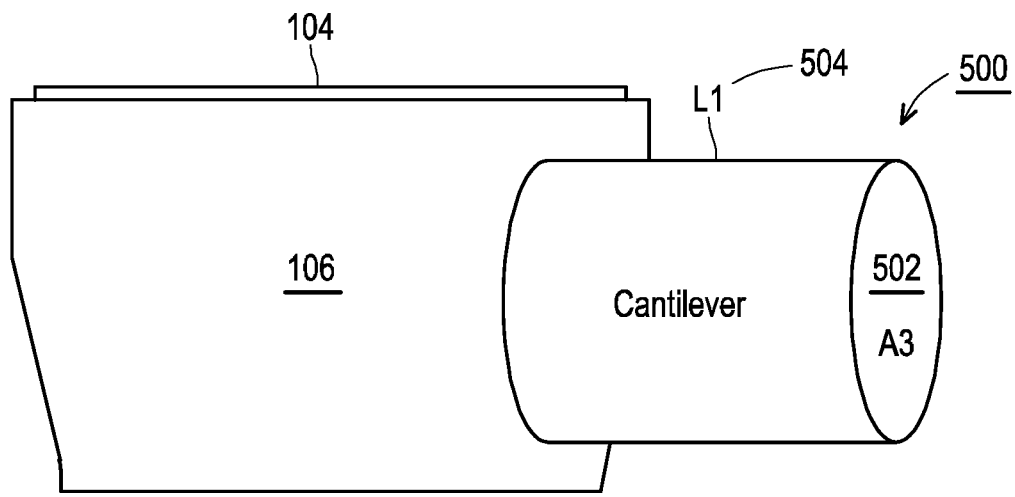
FIG. 5A provides an illustration of an elliptical cantilever for use in a semiconductor manufacturing apparatus in accordance with one embodiment of the subject application.

Referring now to FIG. 5A, there is shown an elliptical cantilever 500 for use in the semiconductor manufacturing apparatus 100 in accordance with another embodiment of the subject application. As shown in FIG. 5A, the cantilever 500 utilizes a generally elliptical component, having a cross section A3 502 and a length L1 504. The skilled artisan will appreciate that the lengths utilized by the cantilevers 200, 400, and 500 are dependent upon the chamber 102 of the semiconductor manufacturing apparatus 100 in which the cantilever 200, 400, 500 is utilized. That is, depending upon size of the chamber 102, the length L1 204, 404, and/or 504 may change to position the electrode housing bowl 106 accordingly.

Figure 5B:
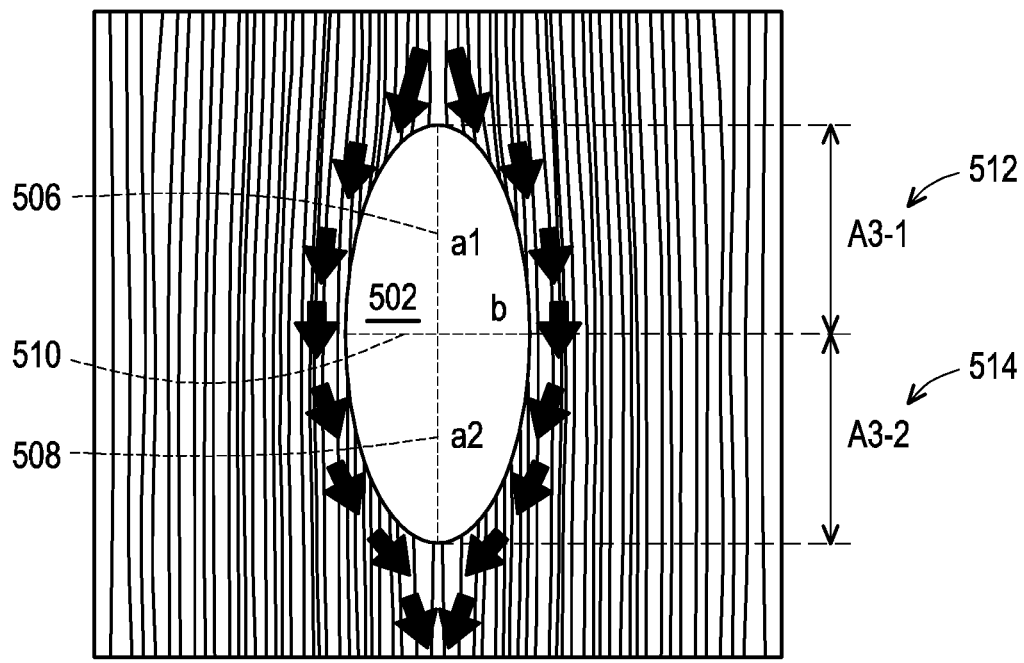
FIG. 5B provides an illustration of the elliptical cantilever of FIG. 5A during operations of a semiconductor manufacturing apparatus in accordance with one embodiment of the subject application.

FIG. 5B provides a cross-sectional view of the cantilever 500 during operations of the semiconductor manufacturing apparatus 100. As shown in FIG. 5B, the flow of gas 108 and/or etch products 120 around the elliptical cantilever 500 does not produce turbulence at the top of the elliptical cantilever 500, as occurring with the square/rectangular shaped cantilever 200 of FIGS. 2A-2B. That is, the flow of gas 108 and/or etch products 120 is not disrupted as they pass around the curve at the apex of the elliptical cross-section. In accordance with one exemplary embodiment, the cross-sectional area A3 502 of the elliptical cantilever 500 is defined by: $0.1 \text{ cm}^2 \leq A3 \leq 70685 \ (\pi*a*b) \text{ cm}^2$. In such an example, the elliptical cantilever 500 utilizes a radius (e.g. a1 506, a2 508, and width b 510), with the length A3-1 512 (associated with a1 506) defined by: $0.1 \text{ cm} \leq b \leq a1 \leq 150 \text{ cm}$ and the length A3-2 514 (associated with a2 508) defined by: $0.1 \text{ cm} \leq b \leq a2 \leq 150 \text{ cm}$. In this example, the elliptical cantilever 500 may be positioned such that the top portion of the elliptical cantilever cross-section A3 502 is lower than or equal to the bottom of the wafer 104, and the bottom portion of the elliptical cantilever cross-section A3 502 is positioned higher than or equal to the top portion of the pump 122.

As will be appreciated by those skilled in the art, the elliptical cantilever 500 of FIGS. 5A-5B improve the flow mechanics within the chamber 102. The airflow depicted in FIG. 5B demonstrates that the flow of gas 108 and etch products 120 are not obstructed as they flow around the curved outer surface of the elliptical cantilever 500 in contrast to the flat top portion of the cantilever 200 of FIGS. 2A-2B. Accordingly, the flow mechanics provided by the elliptical cantilever 500 prevent or reduce turbulence occurring along the top of the elliptical cantilever 500.

In accordance with one example embodiment, the semiconductor manufacturing apparatus 100 of FIG. 1 may be modified to utilize the elliptical cantilever 500. In such an example embodiment, the elliptical cantilever 500 is positioned within the chamber 102, and affixed at one end to the inner chamber wall 116. At the opposite end of the elliptical cantilever 500, the electrode housing bowl 106 is attached to support a wafer 104 during an etch process.

As the etching process begins, a gas 108 is introduced into the chamber 102 via the inlets 110A-110C, an electrode (not shown) within the housing bowl 106 is activated via a suitable source, e.g., an RF match source, or the like. The gas 108 is then ignited to form a plasma cloud or sheath 112 over the wafer 104 within the chamber 102 and etching of the wafer 104 occurs. During this etching, the gas 108 is induced to move without turbulence over the elliptical cantilever 500, as shown in FIG. 5B. While this is occurring, it will be appreciated that etch products 120 are also induced to move without turbulence over the elliptical cantilever 500 toward the pump 122 positioned at the bottom of the chamber 102 and configured to extract or remove the extraneous gas 108 and/or etch products 120 induced to flow by the elliptical cantilever 500.

Figure 6A:
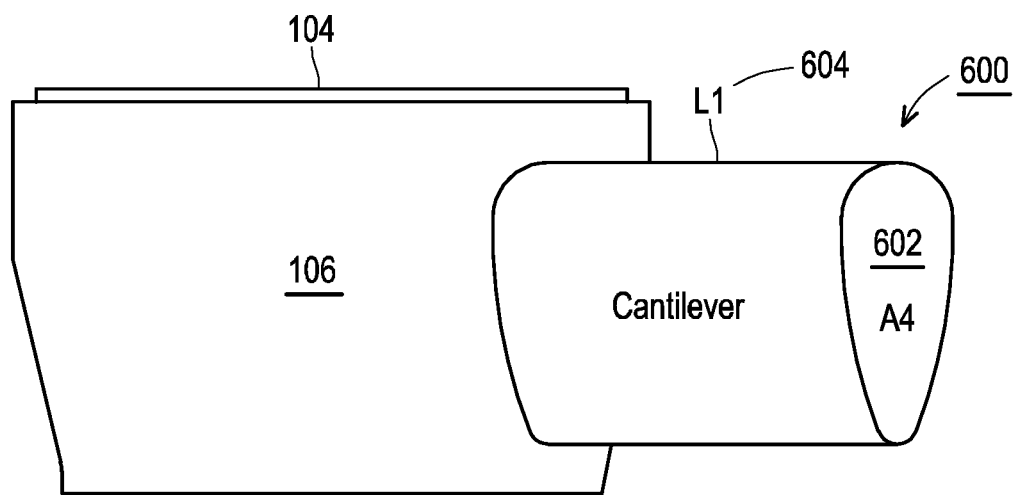
FIG. 6A provides an illustration of an airfoil/wing cantilever for use in a semiconductor manufacturing apparatus in accordance with one embodiment of the subject application.

FIG. 6A depicts a cantilever 600 for use in the semiconductor manufacturing apparatus 100 in accordance with still another embodiment of the subject application. As shown in FIG. 6A, the cantilever 600 utilizes an airfoil/wing shaped component, having a cross section A4 602 and a length L1 604. As noted above with respect to cantilevers 200, 400, and 500, the lengths L1 204, L1 404, L1 504, and L1 604 are determined in accordance with the chamber 102 of the semiconductor manufacturing apparatus 100 in which the cantilever 200, 400, 500, 600 is utilized. Accordingly, depending upon size of the chamber 102, the length L1 204, 404, 504, and/or 604 may change to position the electrode housing bowl 106 accordingly.

Figure 6B:
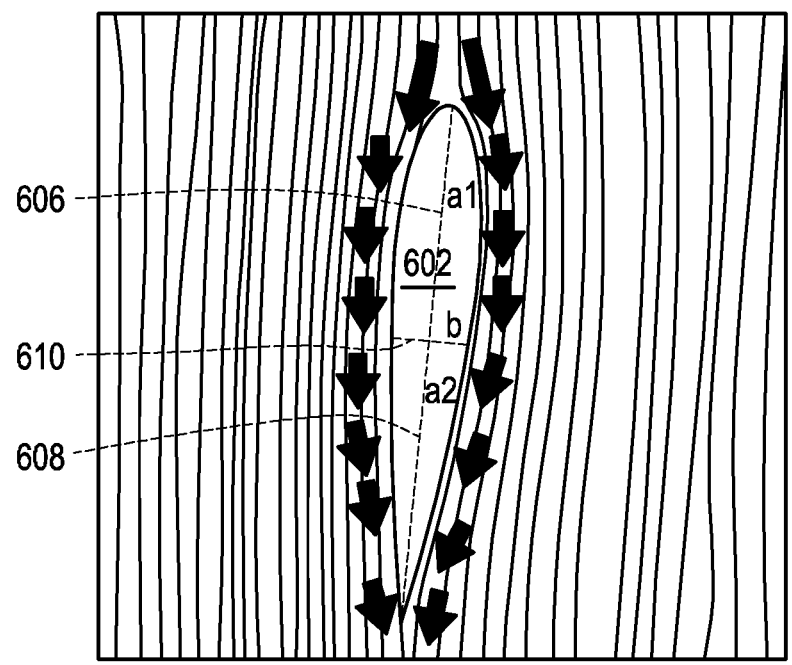
FIG. 6B provides an illustration of the airfoil/wing cantilever of FIG. 6A during operations of a semiconductor manufacturing apparatus in accordance with one embodiment of the subject application.

FIG. 6B provides a cross-sectional view A4 602 of the airfoil/wing cantilever 600 when the semiconductor manufacturing apparatus 100 is processing an associated wafer 104. As shown in FIG. 6B, the flow of gas 108 and/or etch products 120 around the airfoil/wing cantilever 600 does not produce turbulence at the apex of the airfoil/wing cantilever 600. That is, the flow of gas 108 and/or etch products 120 is not disrupted as they pass around the leading edge of the airfoil/wing cantilever 600. In such an example, the airfoil/wing cantilever 600 utilizes a radius (e.g. a1 606, a2 608, b 610). It will be understood that the cross-sectional area of the airfoil/wing cantilever 600 is dependent upon the shape of the airfoil, the upper camber, lower camber, etc., and may include some flat surfaces. Accordingly, the radius depicted in FIG. 6B is intended as an illustrative example according to one embodiment of the subject application. In accordance with one exemplary embodiment, the airfoil/wing cantilever 600 may be positioned such that the leading edge of the airfoil/wing cantilever 600 is lower than or equal to the bottom of the wafer 104, and the trailing edge of the airfoil/wing cantilever 600 is positioned higher than or equal to the top portion of the pump 122.

In some embodiments, the airfoil/wing cantilever 600 may be angled within the chamber 102 to adjust the gas 108 and/or etch product 120 flow toward the pump 122. That is, in such an embodiment, the pitch of the airfoil/wing cantilever 600 may be determined based upon location of the pump 122 on the bottom of the chamber 102. For example, if the pump 122 is located towards a front of the chamber 102, the airfoil/wing cantilever 600 may be angled to direct flow of the gas 108 and/or etch products 120 toward the location of the pump 122. In other embodiments, the airfoil/wing cantilever 600 is rotatably coupled to the inner wall 116 of the chamber 102. In such an embodiment, a controller (not shown) may be configured to adjust the pitch of the airfoil/wing cantilever 600 during operations to enable faster or slower flow of gas 108 and/or etch products 120 around the cantilever 600 toward the pump. It will be appreciated by those skilled in the art that the shape of the airfoil/wing cantilever 600 may be adjusted to increase or decrease flow of the gas 108 and/or etch products 120 in accordance with varying types of gas 108 and/or etch products 120 used.

The skilled artisan will appreciate that the airfoil/wing cantilever 600 of FIGS. 6A-6B improve the flow mechanics within the chamber 102. The airflow depicted in FIG. 6B demonstrates that the flow of gas 108 and etch products 120 are not obstructed as they flow around the curved outer surface of the airfoil/wing cantilever 600 in contrast to the flat top portion of the square/rectangular cantilever 200 of FIGS. 2A-2B. Accordingly, the flow mechanics provided by the airfoil/wing cantilever 600 prevent or reduce turbulence occurring along the leading edge of the airfoil/wing cantilever 600.

Figure 7A:
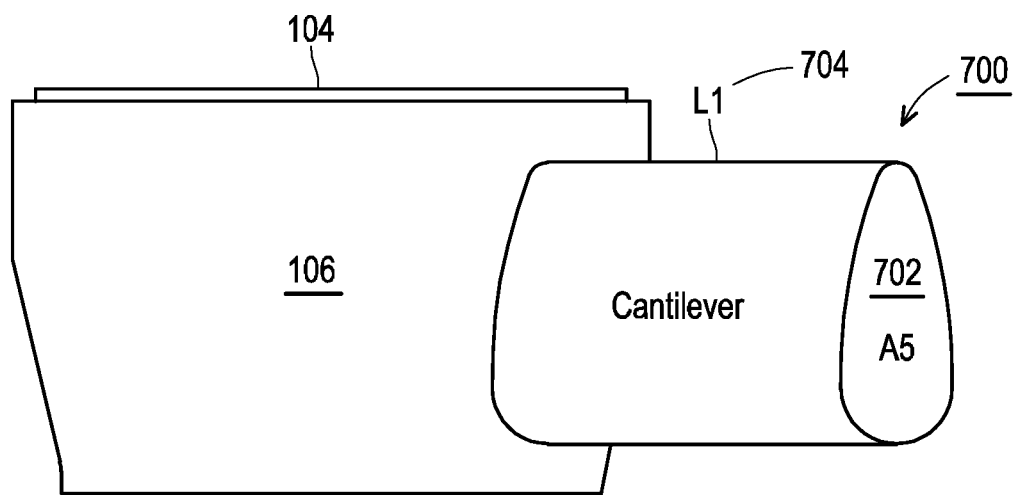
FIG. 7A provides an illustration of an inverted airfoil/wing cantilever for use in a semiconductor manufacturing apparatus in accordance with one embodiment of the subject application.

FIG. 7A depicts a cantilever 700 for use in the semiconductor manufacturing apparatus 100 in accordance with still another embodiment of the subject application. As shown in FIG. 7A, the cantilever 700 utilizes an inverted airfoil/wing shaped component, having a cross section A5 702 and a length L1 704. As noted above with respect to cantilevers 200, 400, 500, and 600 the lengths L1 204, L1 404, L1 504, L1 604, and L1 704 are determined in accordance with the chamber 102 of the semiconductor manufacturing apparatus 100 in which the cantilever 200, 400, 500, 600, 700 is utilized. Accordingly, depending upon size of the chamber 102, the length L1 204, 404, 504, 604, and/or 704 may change to position the electrode housing bowl 106 accordingly.

Figure 7B:
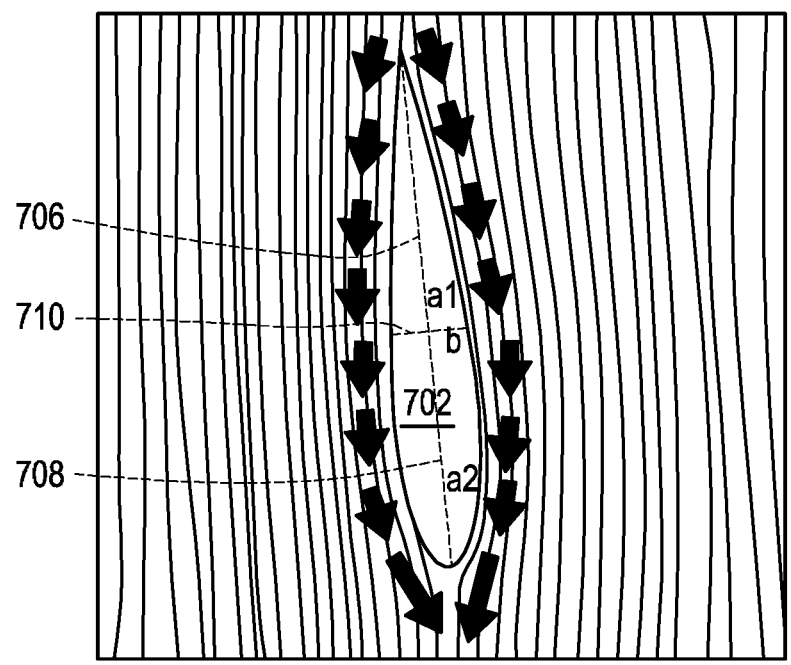
FIG. 7B provides an illustration of the inverted airfoil/wing cantilever of FIG. 7A during operations of a semiconductor manufacturing apparatus in accordance with one embodiment of the subject application.

FIG. 7B provides a cross-sectional view A5 702 of the inverted airfoil/wing cantilever 700 when the semiconductor manufacturing apparatus 100 is processing an associated wafer 104. As shown in FIG. 7B, the flow of gas 108 and/or etch products 120 around the inverted airfoil/wing cantilever 700 does not produce turbulence at the apex of the inverted airfoil/wing cantilever 700. That is, the flow of gas 108 and/or etch products 120 is not disrupted as they pass around the trailing edge of the inverted airfoil/wing cantilever 700. In such an example, the inverted airfoil/wing cantilever 700 utilizes a radius (e.g. a1 706, a2 708, b 710). It will be understood that the cross-sectional area of the airfoil/wing cantilever 700 is dependent upon the shape of the airfoil, the upper camber, lower camber, etc., and may include some flat surfaces. Accordingly, the radius depicted in FIG. 7B is intended as an illustrative example according to one embodiment of the subject application. In accordance with one exemplary embodiment, the inverted airfoil/wing cantilever 700 may be positioned such that the trailing edge of the inverted airfoil/wing cantilever 700 is lower than or equal to the bottom of the wafer 104, and the leading edge of the inverted airfoil/wing cantilever 700 is positioned higher than or equal to the top portion of the pump 122.

In some embodiments, the inverted airfoil/wing cantilever 700 may be angled within the chamber 102 to adjust the gas 108 and/or etch product 120 flow toward the pump 122. That is, in such an embodiment, the pitch of the inverted airfoil/wing cantilever 700 may be determined based upon location of the pump 122 on the bottom of the chamber 102. For example, if the pump 122 is located towards a front of the chamber 102, the inverted airfoil/wing cantilever 700 may be angled to direct flow of the gas 108 and/or etch products 120 toward the location of the pump 122. In other embodiments, the inverted airfoil/wing cantilever 700 is rotatably coupled to the inner wall 116 of the chamber 102. In such an embodiment, a controller (not shown) may be configured to adjust the pitch of the inverted airfoil/wing cantilever 700 during operations to enable faster or slower flow of gas 108 and/or etch products 120 around the cantilever 700 toward the pump. It will be appreciated by those skilled in the art that the shape of the inverted airfoil/wing cantilever 700 may be adjusted to increase or decrease flow of the gas 108 and/or etch products 120 in accordance with varying types of gas 108 and/or etch products 120 used.

The skilled artisan will appreciate that the inverted airfoil/wing cantilever 700 of FIGS. 7A-7B improves the flow mechanics within the chamber 102. The airflow depicted in FIG. 7B demonstrates that the flow of gas 108 and etch products 120 are not obstructed as they flow around the curved outer surface of the inverted airfoil/wing cantilever 700 in contrast to the flat top portion of the square/rectangular cantilever 200 of FIGS. 2A-2B. Accordingly, the flow mechanics provided by the inverted airfoil/wing cantilever 700 prevent or reduce turbulence occurring along the trailing edge of the inverted airfoil/wing cantilever 700.

In accordance with one example embodiment, the semiconductor manufacturing apparatus 100 of FIG. 1 may be modified to utilize the airfoil/wing cantilever 600 described above in place of the cantilever 114. In such an example embodiment, the airfoil/wing cantilever 600 is positioned within the chamber 102, and rotatably attached at one end to the inner chamber wall 116. At the opposite end of the airfoil/wing cantilever 600, the electrode housing bowl 106 is attached to support a wafer 104 during an etch process. The attachments at the inner wall 116 and the electrode housing bowl 106 may be movable to enable the airfoil/wing cantilever 600 to rotate during operations of the etching process. In some embodiments contemplated herein, a motor is affixed to the inner wall 116 and/or the housing 106 to rotate the airfoil/wing cantilever 600. The motor may be controlled by an external source, such as a controller. Alternatively, the airfoil/wing cantilever 600 may be rotatable solely via the flow of the gas 108 and/or etch product 120 over the surface thereof. That is, the direction of the flow of gas 108 and/or etch product 120 over the airfoil/wing cantilever 600 may cause the airfoil/wing cantilever 600 to rotate about its axis in response to the direction of the gas 108 and/or etch product 120 flow. The skilled artisan will appreciate that such movement may improve flow within the chamber 102, thereby increasing the quality of the wafer 104 as inlet gas 108 is directed over the wafer 104 and etch product 120 is directed away from the wafer 104.

As a gas 108 is introduced into the chamber 102 via the inlets 110A-C, an electrode (not shown) located within the housing bowl 106 is activated via a suitable source, e.g., an RF match source, high voltage generator, or the like. A plasma sheath or cloud 112 is formed over the wafer 104 within the chamber 102 and etching of the wafer 104 occurs. During this etching, the gas 108 is induced to move without turbulence over the airfoil/wing cantilever 600, as shown in FIG. 6B. While this is occurring, it will be appreciated that etch products 120 are formed from removal of materials from the wafer 104 and are also induced to move without turbulence over the airfoil/wing cantilever 600 toward the pump 122 positioned at the bottom of the chamber 102 and configured to extract or remove the extraneous gas 108 and/or etch products 120 induced to flow by the airfoil/wing cantilever 600.

It will be appreciated by those skilled in the art that the use of a dry etch process is intended solely to be one example implementation of the foregoing cantilever 400, 500, 600 embodiments. The designs set forth above are configured to induce the flow of any suitable fluid within a wet, dry, or other semiconductor wafer processing chamber. As such, the skilled artisan will appreciate that the cantilever 400, 500, 600 may be utilized to support a wafer 104 for processing in a myriad of varying process chambers.

Figure 8:
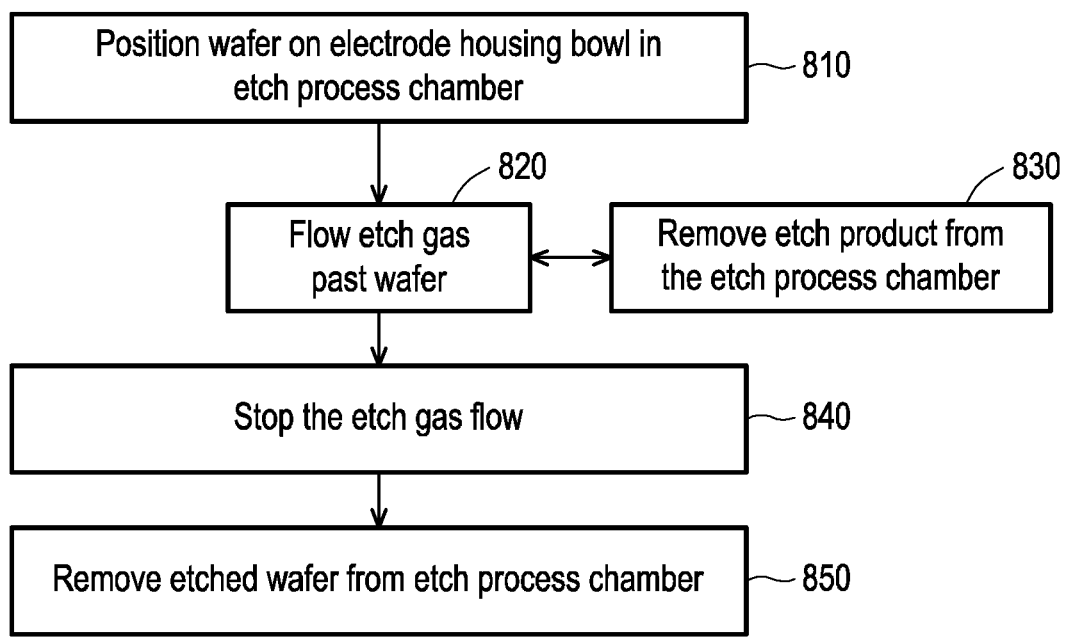
FIG. 8 is a flowchart illustrating a method for operating a semiconductor manufacturing apparatus in accordance with one embodiment of the subject application.

FIG. 8 is a flowchart illustrating a method for operating a semiconductor manufacturing apparatus in accordance with one embodiment of the subject application. In step 810, the wafer is positioned on an electrode housing bowl within an etch process chamber. In step 820, an etch gas is flowed past the wafer to etch the wafer. In step 830, an etch product is removed from the etch process chamber, for example using a pump. It is noted that steps 820 and 830 can be considered as occurring concurrently. In step 840, the etch gas flow is stopped. The pumping may continue until the environment of the etch process chamber reaches a safe state. After a suitable time period, the etched wafer can be removed from the etch process chamber.

In accordance with one embodiment, there is provided a cantilever for gas flow direction control configured to support an electrode housing bowl in an associated etch process chamber. The cantilever is coupled to an inner wall of the associated process chamber. The cantilever has a curved profile, for example a cylindrical, elliptical, or airfoil/wing shape.

In accordance with another embodiment, there is provided an etch process chamber that includes an electrode housing bowl positioned in a center of the interior of the process chamber. A cantilever couples the electrode housing bowl to an interior wall of the process chamber. The cantilever has a curved profile to reduce turbulence. In addition, the etch process chamber comprises a pump configured to remove at least one of an etch gas or an etch product from the interior of the process chamber.

In accordance with still another embodiment, there is provided a semiconductor manufacturing apparatus. The semiconductor manufacturing apparatus includes an etch process chamber that comprises a cantilever and an electrode housing bowl. The cantilever is coupled to an interior wall of the process chamber and is configured to direct a flow of at least one of an etch gas or an etch product within the process chamber. The cantilever has a cross-sectional profile that is cylindrical, elliptical, or an airfoil. The electrode housing bowl is positioned in the center of the interior of the process chamber and coupled to the cantilever. The semiconductor manufacturing apparatus also comprises a pump positioned outside the etch process chamber and configured to remove at least one of an etch gas or an etch product from the interior of the process chamber.

In accordance with another embodiment, there is provided a method of etching a wafer. The method includes positioning the wafer on an electrode housing bowl within an etch process chamber. The method also includes flowing an etch gas past the wafer to etch the wafer. In addition, the method includes removing an etch product from the etch process chamber. In such an embodiment, the electrode housing bowl is coupled to an interior wall of the process chamber by a cantilever, the cantilever having a curved profile to reduce turbulence.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An etch process chamber, comprising:
   an electrode housing bowl positioned in a center of an interior of the etch process chamber, the etch process chamber including a first portion where an etch gas enters the interior of the etch process chamber and a second portion where the etch gas exits the interior of the etch process chamber, and the electrode housing bowl configured to hold a wafer with a wafer surface oriented towards the first portion;
   a gas inlet positioned within the etch process chamber first portion;
   a pump configured to remove at least one of the etch gas or an etch product from the interior of the process chamber via the second portion of the etch process chamber; and
   a cantilever coupling the electrode housing bowl to an interior wall of the etch process chamber, the cantilever configured to route one or both of a power and a control cable through the cantilever coupling to the electrode housing bowl, the cantilever having an airfoil shape, and the cantilever having a continuous curved outer surface profile to reduce turbulence of the etch gas as it flows through the interior of the etch process chamber from the etch gas inlet around the cantilever coupling and towards the pump and out of the etch process chamber, and the airfoil shape having a leading edge positioned against a flow direction of the etch gas as it flows through the interior of the etch process chamber from the etch gas inlet;
   wherein the cantilever airfoil shape leading edge has a leading edge height lower than or equal to a height of the wafer, the cantilever airfoil shape has a trailing edge having a trailing edge height higher than or equal to a height of the pump, the leading edge has a surface profile with a first radius, and the trailing edge has a surface profile with a second radius less than the first radius to provide an apex of the cantilever airfoil shape.

2. The etch process chamber of claim 1, wherein the cantilever is located to induce a flow of at least one of the etch gas or the etch product to an associated wafer positioned on the electrode housing bowl.

3. The etch process chamber of claim 1, wherein the cantilever is located to induce a flow of at least one of the etch gas or the etch product to the pump.

4. The etch process chamber of claim 1, wherein the etch gas comprises $C_xH_yF_z$ where x is 1 to 6, y is 0 to 6, and z is 1 to 6; He; Ar; $F_2$; $Cl_2$; $O_2$; $N_2$; $H_2$; HBr; HF; $NF_3$; or $SF_6$.

5. The etch process chamber of claim 1, wherein the etch product comprises FCN; $CO_x$ where x is 1 or 2; $SiCl_x$ where x is 1 to 4; or $SiF_x$ where x is 1 to 4.

6. A semiconductor manufacturing apparatus, comprising:
   an etch process chamber, comprising:
   a cantilever coupled to an interior wall of the process chamber, the cantilever configured to direct a flow of at least one of an etch gas or an etch product within the etch process chamber,
   an electrode housing bowl positioned in a center of the interior of the etch process chamber and coupled to the cantilever; and
   a pump positioned outside the etch process chamber and configured to remove at least one of an etch gas or an etch product from the interior of the etch process chamber;
   wherein the cantilever is configured to route one or both of a power and a control cable through the cantilever to the electrode housing bowl, the cantilever has an airfoil shape and the cantilever has a continuous curved outer surface profile to reduce turbulence of the etch gas as it flows through the interior of the etch process chamber from an etch gas inlet around the cantilever and towards the pump and out of the etch process chamber, and the airfoil shape has a leading edge positioned against a flow direction of the etch gas as it flows through the interior of the etch process chamber from the etch gas inlet;
   wherein the cantilever airfoil shape has a leading edge portion extending along a first length of the cantilever, a trailing edge portion extending along a second length of the cantilever, and a maximum width of the leading edge portion is different from a maximum width of the trailing edge portion.

7. The semiconductor manufacturing apparatus of claim 6, wherein the cantilever is located to induce a flow of at least one of the etch gas or the etch product to an associated wafer positioned on the electrode housing bowl.

8. The semiconductor manufacturing apparatus of claim 6, wherein the cantilever is located to induce a flow of at least one of the etch gas or the etch product to the pump.

9. The semiconductor manufacturing apparatus according to claim 6, wherein the maximum width of the leading edge portion is greater than the maximum width of the trailing edge portion.

10. The semiconductor manufacturing apparatus according to claim 6, wherein the maximum width of the leading edge portion is less than the maximum width of the trailing edge portion.

11. The semiconductor manufacturing apparatus of claim 6, wherein the etch gas comprises $C_xH_yF_z$ where x is 1 to 6, y is 0 to 6, and z is 1 to 6; He; Ar; $F_2$; $Cl_2$; $O_2$; $N_2$; $H_2$; HBr; HF; $NF_3$; or $SF_6$.

12. The semiconductor manufacturing apparatus of claim 6, wherein the etch product comprises FCN; $CO_x$ where x is 1 or 2; $SiCl_x$ where x is 1 to 4; or $SiF_x$ where x is 1 to 4.

13. A semiconductor wafer etch process chamber, comprising:
an electrode housing bowl positioned in a center of an interior of the etch process chamber, the etch process chamber including a first portion where an etch gas enters an interior of the etch process chamber and a second portion where the etch gas exits the interior of the etch process chamber, and the electrode housing bowl configured to hold a wafer with a wafer surface oriented towards the first portion;
a gas inlet positioned at the etch process chamber first portion;
a pump configured to remove at least one of the etch gas or an etch product from the interior of the etch process chamber via the second portion of the etch process chamber; and
a cantilever coupling the electrode housing bowl to an interior wall of the etch process chamber, the cantilever configured to route one or both of a power and a control cable through the cantilever to the electrode housing bowl, the cantilever having an inverted airfoil shape and the cantilever having a continuous curved outer surface profile to reduce turbulence of the etch gas as it flows through the interior of the etch process chamber from the etch gas inlet around the cantilever and towards the pump and out of the etch process chamber, and the inverted airfoil shape having a leading edge positioned against a flow direction of the etch gas as it flows through the interior of the etch process chamber from the etch gas inlet;
wherein the cantilever inverted airfoil shape leading edge has a leading edge height lower than or equal to a bottom height of the wafer, the cantilever inverted airfoil shape has a trailing edge having a trailing edge height higher than or equal to a top portion height of the pump, the leading edge has a surface profile with a first radius, and the trailing edge has a surface profile with a second radius greater than the first radius where the first radius provides an apex of the cantilever inverted airfoil shape.

14. The semiconductor wafer etch process chamber according to claim 13, wherein the cantilever is located to induce a flow of at least one of the etch gas or the etch product to a wafer secured to the electrode housing bowl.

15. The semiconductor wafer etch process chamber of claim 13, wherein the etch gas comprises $C_xH_yF_z$ where x is 1 to 6, y is 0 to 6, and z is 1 to 6; He; Ar; $F_2$; $Cl_2$; $O_2$; $N_2$; $H_2$; HBr; HF; $NF_3$; or $SF_6$.

16. The semiconductor wafer etch process chamber of claim 13, wherein the etch product comprises FCN; $CO_x$ where x is 1 or 2; $SiCl_x$ where x is 1 to 4; or $SiF_x$ where x is 1 to 4.

* * * * *